(12) United States Patent
Dunne

(10) Patent No.: US 7,898,069 B2
(45) Date of Patent: Mar. 1, 2011

(54) STACKED FLIP-ASSEMBLED SEMICONDUCTOR CHIPS EMBEDDED IN THIN HYBRID SUBSTRATE

(75) Inventor: Rajiv C Dunne, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/365,606

(22) Filed: Feb. 4, 2009

(65) Prior Publication Data

US 2009/0166832 A1 Jul. 2, 2009

Related U.S. Application Data

(62) Division of application No. 11/612,041, filed on Dec. 18, 2006, now Pat. No. 7,504,283.

(51) Int. Cl.
*H01L 23/02* (2006.01)
(52) U.S. Cl. .................. 257/680; 257/685; 257/686; 257/701; 257/723; 257/E25.006
(58) Field of Classification Search .............. 257/680, 257/685, 686, E25.006, E25.027
See application file for complete search history.

(56) References Cited

U.S. PATENT DOCUMENTS

| | | | | |
|---|---|---|---|---|
| 5,777,391 A | * | 7/1998 | Nakamura et al. | 257/778 |
| 6,784,530 B2 | * | 8/2004 | Sugaya et al. | 257/686 |
| 2001/0015485 A1 | * | 8/2001 | Song et al. | 257/679 |
| 2004/0118500 A1 | * | 6/2004 | Wang | 156/60 |
| 2005/0067711 A1 | * | 3/2005 | Opheim | 257/774 |

* cited by examiner

*Primary Examiner*—Angel Roman
(74) *Attorney, Agent, or Firm*—Yingsheng Tung; Wade J. Brady, III; Frederick J. Telecky, Jr.

(57) ABSTRACT

A semiconductor system having a substrate (101) including a rigid insulating interposer (110) with a high modulus and a top (140) and a bottom (150) low-modulus tape with flip-attached semiconductor chips (120, 130). The assembled chips, with the passive surfaces facing each other, are located in an opening (114) of the interposer, which has a thickness (111) equal to or smaller than the sum of the assembled two chips. Adhesive material (160) holds the tapes parallel to the interposer and the chip surfaces together. Solder balls (180) and discrete components (170) may be attached to the outside surfaces of the tapes.

12 Claims, 8 Drawing Sheets

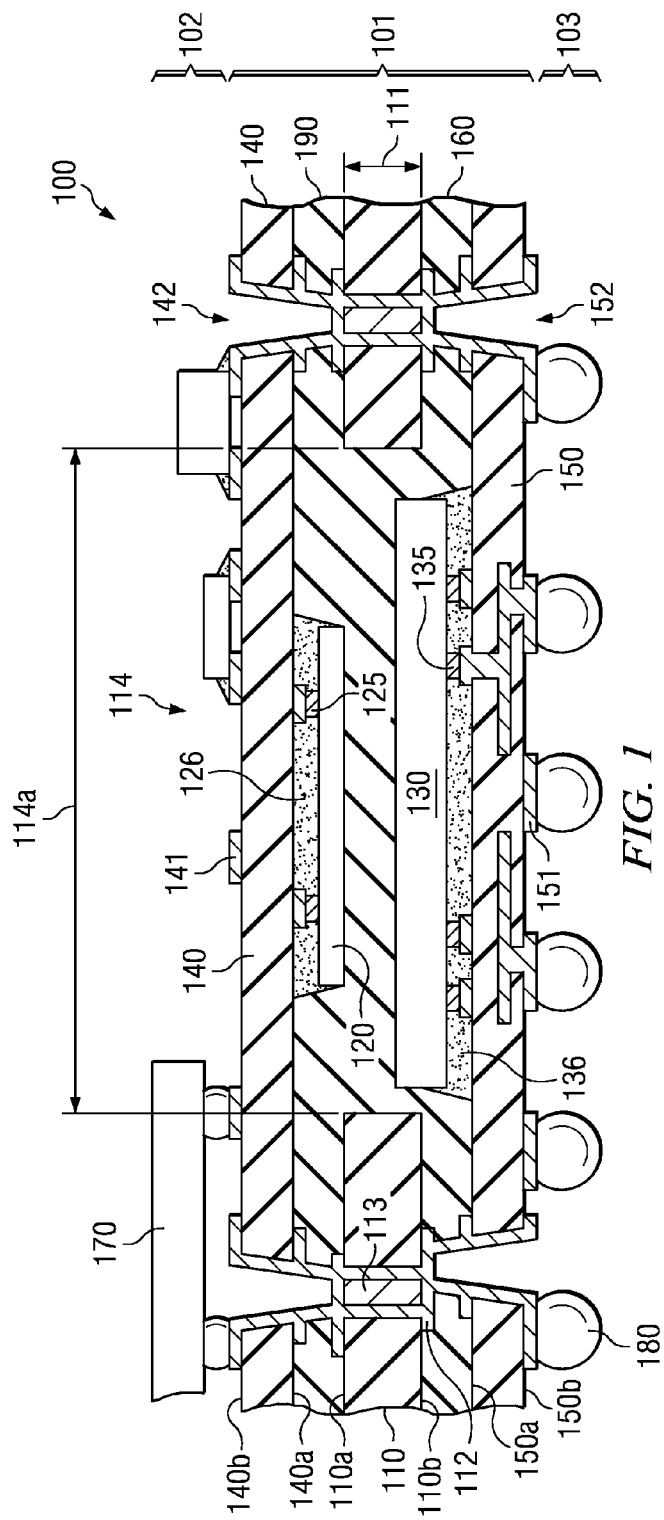
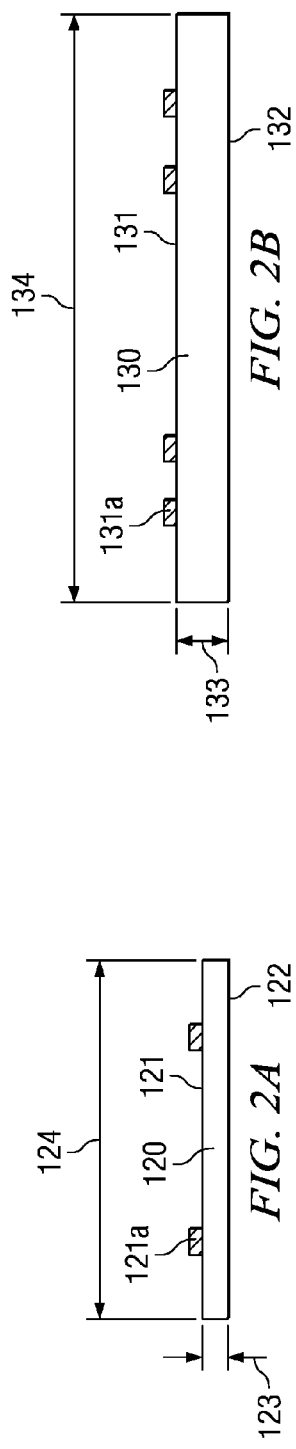

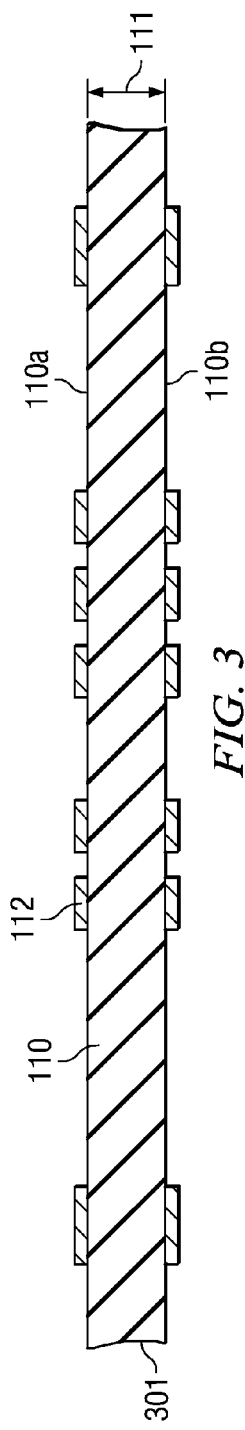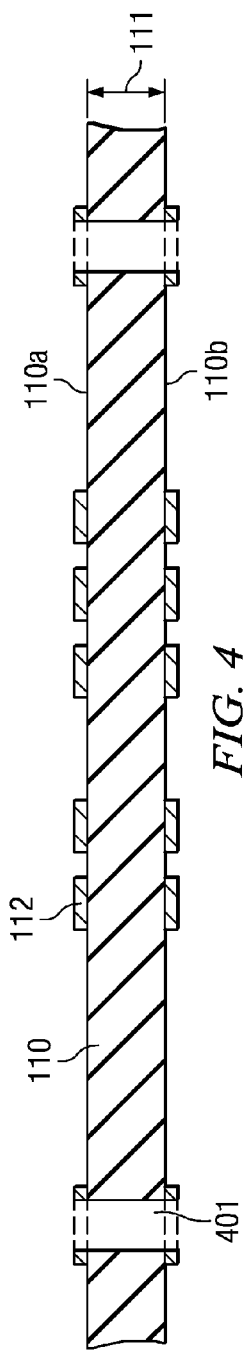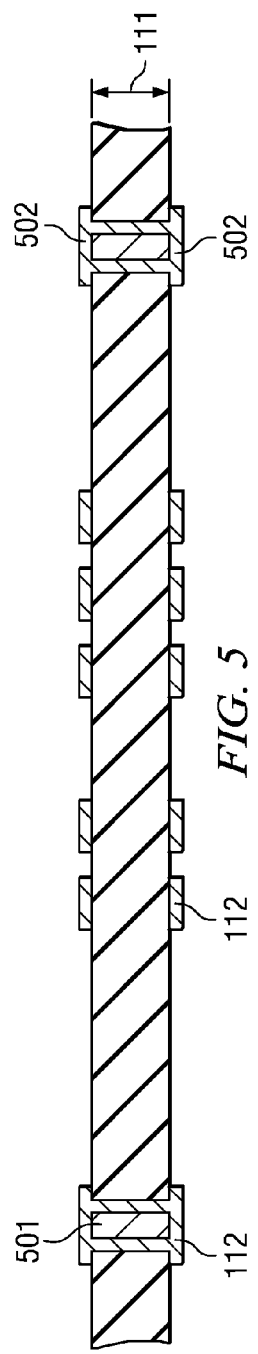

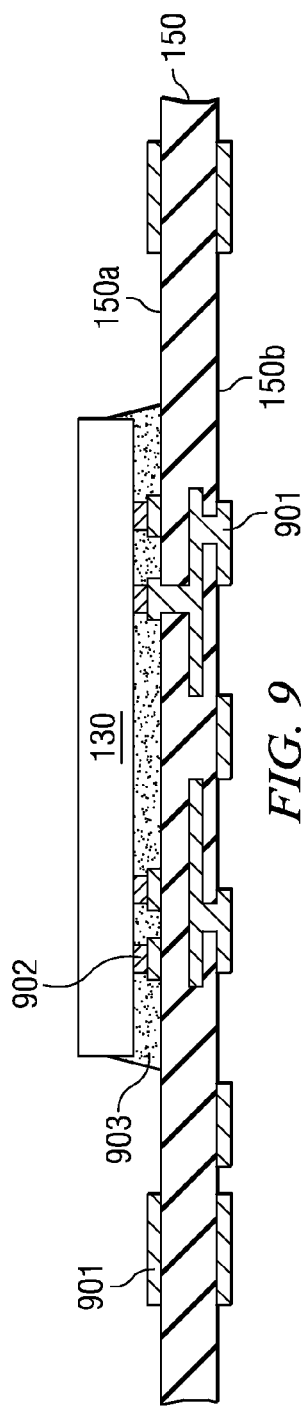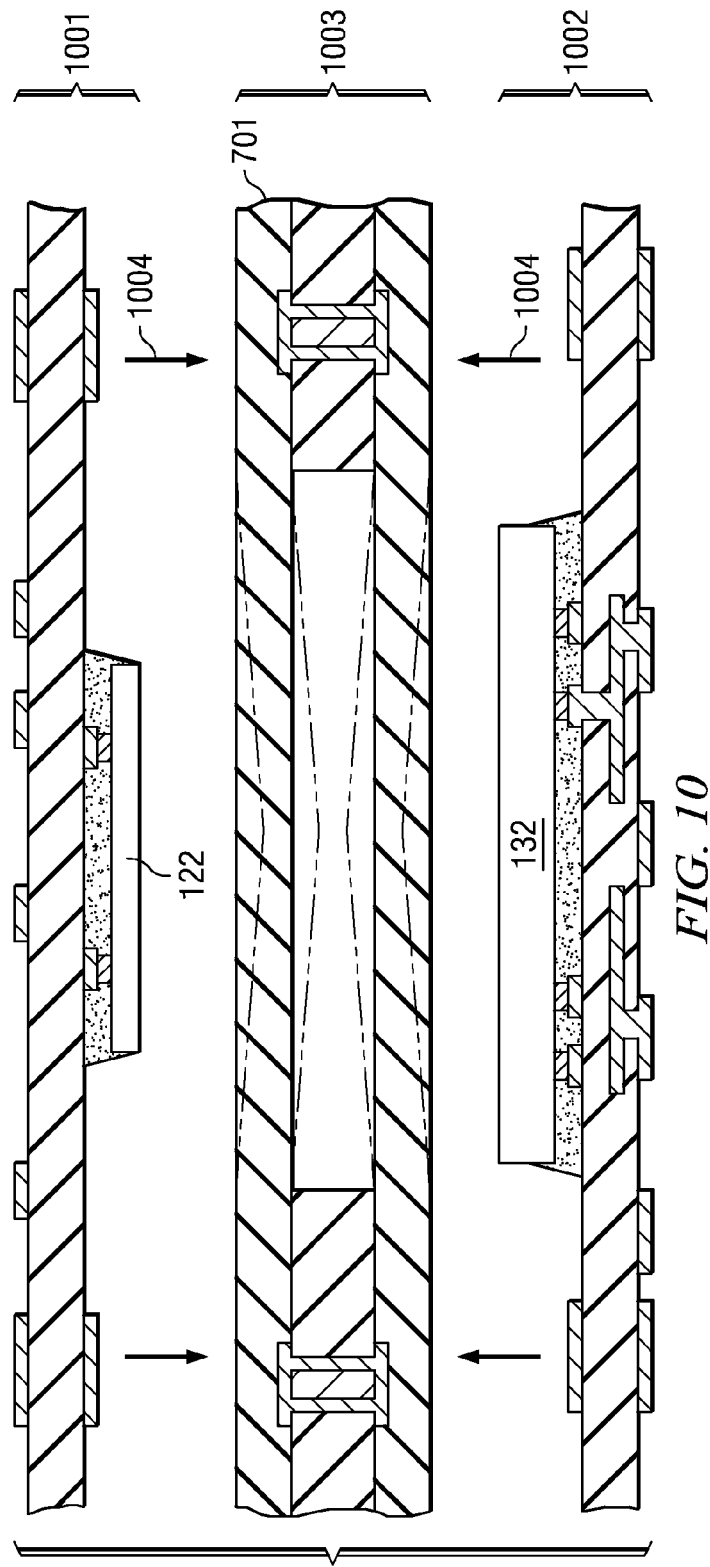

STACKED FLIP-ASSEMBLED SEMICONDUCTOR CHIPS EMBEDDED IN THIN HYBRID SUBSTRATE

This is a division of application Ser. No. 11/612,041 filed Dec. 18, 2006, the contents of which are herein incorporated by reference in its entirety.

FIELD OF THE INVENTION

The present invention is related in general to the field of semiconductor devices and processes, and more specifically to low profile semiconductor substrates, which include vertically integrated stacked chips.

DESCRIPTION OF THE RELATED ART

Electronic products have, at their core, printed circuit boards, which assemble and interconnect the semiconductor devices, passive components, control devices, power supplies, and display devices, which are needed in the particular product. Today, an increasing number of these electronic products, such as hand-held wireless telephones, electronic cameras, and portable computers, are subjected to market trends, which require an on-going shrinking of the product outlines, volume and weight, and for which, therefore, the size, space, and weight required by the boards are at a premium. Other applications requiring shrinking board space are the controls and sensors in automobiles, airplanes and rockets.

In order to shrink board outlines, present technology focuses on reducing the board area consumed by each individual part assembled on a board; for instance, concerted efforts are expended to shrink the package of the semiconductor devices and passive components. Progress in this effort is only gradual and slow. Furthermore, the known solutions to reduce the thickness of boards and components are unsatisfactory, especially for the chip-first approach of embedding active chips in substrates, since any problem with the subsequent substrate build-up fabrication would put the expensive known-good chip at risk.

SUMMARY OF THE INVENTION

Applicant recognizes the need for a step function progress in reducing board thickness and outlines, especially for device-stacking and package-on-package methods for semiconductor devices and electronic systems. The novel strategy for stacking chips and packages will shorten the time-to-market of innovative products, which utilize available chips of various capabilities (such as processor and memory chips, and will nor have to wait for a redesign of the chips.

Applicants' approach is an embedding process, which combines a solution for a low-profile system with a low risk of causing a yield loss due to a problem in the substrate fabrication. The "integrated substrate" can be the base for a vertically integrated semiconductor system, which may include integrated circuit chips of functional diversity. The resulting system exhibits excellent electrical performance, mechanical stability, and high product reliability. Further, it is a technical advantage that the fabrication method of the system is flexible enough to be applied for different semiconductor product families and a wide spectrum of design and process variations.

One embodiment of the invention is a hybrid substrate, which includes a rigid insulating interposer with a high modulus and a top and a bottom low-modulus tape with flip-attached semiconductor chips. The assembled chips, with the passive surfaces facing each other, are located in an opening of the interposer, which has a thickness equal to or smaller than the sum of the assembled two chips. Adhesive material holds the tapes parallel to the interposer and the chip surfaces together. Solder balls and discrete components may be attached to the outside surfaces of the tapes.

Another embodiment of the invention is a method for fabricating a semiconductor system, which includes an integrated substrate. In the method, an opening is formed through a rigid insulating interposer of high modulus. Sheets of insulating and adhesive material are laminated on the interposer surface so that the sheets stretch over the opening. Providing insulating tapes of low modulus, a first chip is flip-attached to the first tape, and a second chip is flip-attached to the second tape. With the non-attached surfaces facing each other, the chips are aligned with the sheet-covered opening of the interposer. After raising the temperature to soften the sheets, the chips are moved from opposite directions against the sheets to deform them into the opening until they meet at an interface. All available space is filled by the sheets and the material is polymerized.

As an example, a substrate system including 50 µm thick chips attached by 30 µm bumps and a separation of the passive surfaces by 10 µm can be realized by a 100 µm thick interposer with 35 µm thick adhesive sheets on both of its surfaces. Using a one-layer tape of 75 µm thickness on top and a two-layer tape of 150 µm thickness on bottom, results in a total substrate thickness of 395 µm—considerably thinner than a half millimeter.

Active or passive electrical components may be attached to one substrate surface, and solder balls may be attached to the other substrate surface. When the starting interposer was in strip form, the process may conclude by singulating the assembled interposer strip into discrete units.

The fabrication method can be modified in various ways, for instance by inversing the respective moduli of the interposer and the tapes, or by applying the adhesive sheets before creating the interposer opening, or by creating more than opening per device, or by creating a plurality of vias.

It is a technical advantage that the invention is flexible with regard to the type, number and interconnection of the chips and active and passive components. The resulting system of stacked semiconductor devices lends itself to minimization not only of the assembly area required for the system, but also of the overall system thickness.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 1 shows a schematic cross section of an electronic system, which has a substrate with embedded semiconductor chips according to an embodiment of the invention.

FIGS. 2A through 13 illustrate process steps in the fabrication of an integrated substrate according to another embodiment of the invention.

FIG. 2A is a schematic cross section of a semiconductor chip.

FIG. 2B is a schematic cross section of another semiconductor chip.

FIG. 3 shows a schematic cross section of an insulating interposer with conductive traces on the surfaces.

FIG. 4 illustrates a schematic cross section of cylindrical vias through the interposer.

FIG. 5 shows a schematic cross section of metal-filled vias through the interposer.

FIG. 6 illustrates a schematic cross section of an opening through the interposer.

FIG. 7 shows a schematic cross section of insulating, adhesive sheets laminated over the interposer and the opening.

FIG. 8 shows a schematic cross section of the chip of FIG. 2A flip-attached to a first insulating tape.

FIG. 9 shows a schematic cross section of the chip of FIG. 2B flip-attached to a second insulating tape.

FIG. 10 illustrates schematically the process step of aligning the assembled chips with the sheet-covered opening and moving the chips to deform the sheets.

FIG. 11 illustrates a schematic cross section of the integrated substrate after the available space between the interposer, tapes and chips is filled with adhesive material.

FIG. 12 shows a schematic cross section of metal-lined connections between the contact pads of the tapes and the conductive vias.

FIG. 13 is a schematic cross section of the integrated substrates with solder balls attached to contact pads of a tape surface.

DETAILED DESCRIPTION OF THE PREFERRED EMBODIMENTS

Figure 6:
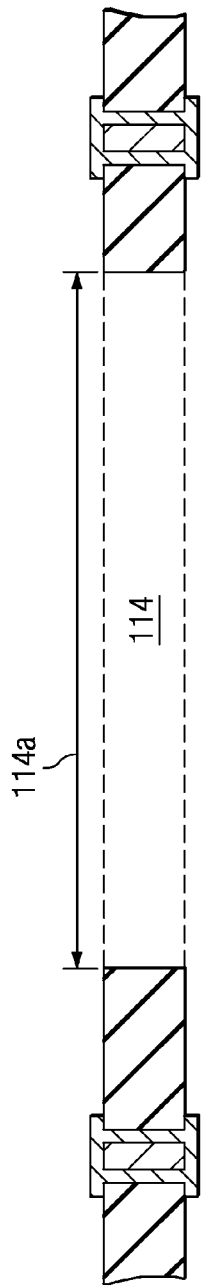

As an embodiment of the invention, FIG. 1 illustrates a schematic cross section of an semiconductor system generally designated 100. System 100 includes a substrate 101, a variety of electronic components 102 attached to contact pads on one substrate surface, and solder balls 103 for connection to external parts attached to the other substrate surface. Substrate 101 has been singulated by cut lines 190 into discrete units.

Substrate 101 is a subsystem in its own right. It includes a rigid insulating interposer 110 with a first surface 110a and a second surface 110b. A preferred interposer material is glass-filled epoxy with a modulus between about 18 and 25 GPa; alternate materials may include ceramic or other relatively high-modulus compounds. Interposer 110 has a thickness 111, which should be equal to or smaller than the sum of the assembly thicknesses of the first semiconductor chip 120 and the second semiconductor chip 130. In order to produce a thin substrate, it is preferred to keep interposer thickness 111 between 30 and 250 μm.

Insulating interposer 110 further has conductive traces 112 on first surface 110a and second surface 110b; they serve as a network of electrical interconnections. In addition, interposer 110 has cylindrical vias 113, which extend through thickness 111 from the first surface 110a to the second surface 110b, are filled with metal and contact traces 112. Vias 113 may have sidewalls lined with metal layer (such as copper), or they may be filled with metal (such as copper), or with metal-filled epoxy (for example, copper-filled epoxy). Interposer may have a plurality of cylindrical vias in numerous locations.

Interposer 110 further has at least one opening 114 (dashed line) through the thickness 111; FIG. 1 illustrates the length 114a of the opening. Length 114a is greater than the length of the first chip and the length of the second chip.

Embedded in substrate 101 are assembled first semiconductor chip 120 and assembled second semiconductor chip 130; these chips are illustrated in more detail in FIGS. 2A and 2B. First chip 120 has an "active" surface 121 (the surface on which the active semiconductor components and contact pads 121a are located) and a "passive" surface 122 (the surface devoid of active components). Chip 120 has a thickness 123 and a length 124.

Second chip 130 has an "active" surface 131 with contact pads 131a, and a "passive" surface 132. Chip 130 has a thickness 133, which may be equal to, or different from first chip thickness 123. Chip 130 has a length 134, which may be equal to, or different from first chip length 124. For some devices, chip thickness 123 or 133 may be in the range from 225 to 275 μm; however, the trend of the semiconductor industry is towards thinner chips in the range from 25 to 75 μm. An example of a preferred chip thickness is 50 μm.

A stated above, interposer 110 has a thickness 111 equal to or smaller than the thickness sum of the assembled first and second chips, and a length 114a of opening 114 greater than the length of the first and the second chip. For the quoted preferred thickness of 50 μm for each chip, and a bump height of 30 μm of each chip, a preferred interposer thickness is 100 μm.

In FIG. 1, substrate 101 has a first insulating tape 140 with conductive traces. Tape 140 is preferably polyimide-based with a modulus between about 3 and 9 GPa. With this range, the modulus of tape 140 is 50% or less than the modulus of interposer 110. As a consequence, tape 140 is frequently referred to as having a "low" modulus compared to the "high" modulus of interposer 110. Tape 140 has a third surface 140a and a fourth surface 140b; both surfaces include contact pads 141. Dependent on the number of metal levels for the conductive traces, the thickness of tape 140 may range from about 25 to 200 μm.

Substrate 101 further has a second insulating tape 150 with conductive traces. Tape 150 is preferably polyimide-based with a modulus between about 3 and 9 GPa, which is 50% or less than the modulus of interposer 110. Tape 150 has a fifth surface 150a and a sixth surface 150b; both surfaces include contact pads 151. Dependent on the number of metal levels for the conductive traces, the thickness of tape 150 may range from about 25 to 200 μm. In FIG. 1, tape 150 is depicted thicker than tape 140.

Using metal bumps 125 (preferably gold or copper, in some devices solder), the active surface 121 of first chip 120 is flip-attached to the contact pads of the third surface 140a. As FIG. 1 indicates, an underfill material 126 (most often a polymeric precursor) is preferably used to fill the spaces between the bumps.

Using metal bumps 135 (preferably gold or copper, in some devices solder), the active surface 131 of second chip 130 is flip-attached to the contact pads of the fifth surface 150a. As FIG. 1 indicates, an underfill material 136 (frequently a polymeric precursor) is preferably used to fill the spaces between the bumps.

As FIG. 1 illustrates, first chip 120 and second chip 130, attached to first tape 140 and second tape 150 respectively, are located inside the interposer opening 114. The chips are positioned so that their passive surfaces face each other. In addition, the tapes are spaced substantially parallel to the interposer 110.

FIG. 1 further illustrates that the passive surfaces of the chips are attached to each other by a layer 160 of adhesive material. Preferably, this adhesive material is an epoxy-based B-stage compound without fillers, which is applied in flexible sheets (see description below) and fully polymerized at elevated temperatures. The thickness of layer 160 is preferably in the range between 10 and 100 μm, most preferably about 10 μm.

The same adhesive B-stage material without fillers is employed to attach first surface 110a to third surface 140a and the second surface 110b to the fifth surface 150a.

When electrical connectivity is required from the fourth surface 140b to the sixth surface 150b, a metal-lined via 142 reaches through first tape 140 to a metal-filled interposer via 113. Preferably, the metal lining is provided by plated copper. An additional metal-lined via 152 reaches through second tape 150 to the same interposer via 113. Alternatively, metal-filled paste in the vias may be used instead of the metal lining; preferably, the paste includes copper.

FIG. 1 depicts a plurality of electronic components 170 attached to the contact pads of the outer (fourth) surface 140b of the first tape. Examples of components include Ball-Grid Array packages of memory devices, capacitors, and resistors. FIG. 1 further depicts reflow bodies 180 (preferably tin-alloy solder balls) attached to the contact pads of the outer (sixth) surface 150b of the second tape. These reflow bodies provide the means for attachment to external parts such as boards and substrates.

Another embodiment of the invention is a method for fabricating a semiconductor system, which can be used as a substrate for more complex electronic systems. A number of steps of a preferred process flow is detailed in FIGS. 2A to 13, with FIG. 1 illustrating an example of a final, more complex electronic application. The process flow starts in FIG. 2A with providing a first semiconductor chip 120 having an active (121) and a passive (122) surface, a thickness 123, and a length 122. As stated earlier, the thickness for many devices may still be on the order of 225 μm, but the trend is towards thin chips of 50 μm or less.

The next step, depicted in FIG. 2B, is providing a second semiconductor chip 130. Its thickness 133 may be the same as the first chip thickness 123, or it may be different; its length 134 may be the same as the first chip length 124, or it may be different. Second chip 130 has an active surface 131 and a passive surface 132.

In FIG. 3, an insulating interposer 110 is provided. In order to enable batch processing, it is preferred to provide the interposer in strip form, as indicated in FIG. 3 by contours 301, and then singulate the discrete units from the strip after completing the last fabrication step, preferably by sawing. The insulating interposer material is preferably a rigid epoxy-glass laminate such as FR-4, FR-5 or a related compound. The modulus of this material is preferably in the range from about 18 to 25 GPa.

Interposer 110 has a thickness 111 equal to or smaller than the sum of the thickness 123 of the assembled first chip and the thickness 133 of the assembled second chip. Dependent on the chip thicknesses and the height of the bumps, interposer thickness is preferably from about 30 to 250 μm. Interposer 110 further has a first surface 110a and a second surface 110b. On one surface, or on both surfaces are conductive traces 112, preferably formed by etch-patterning a layer of copper.

In the process step depicted in FIG. 4, cylindrical vias 401 are drilled (mechanically or by laser) through the interposer 110, extending through the thickness 111 from the first surface 110a to the second surface 110b. The interposer strip may include numerous via holes. The sidewalls of the vias are then plated with copper and filled (FIG. 5) with an electrical conductor 501, preferably a paste containing copper or a copper alloy. Copper paste is commercially available from Tatsuta, Japan, for example models AE1244 and AE3030. The metal-filled vias are contacting some of the conductive traces 112 on one or both interposer surfaces.

Alternatively, an additional surface finish step including electrolytic nickel/gold, electroless nickel, and immersion gold, or a copper plating step may be used to define the circuit pattern 502 of both via sides.

In the next process step (see FIG. 6), an opening 114 is formed in interposer 110, preferably by punching. The lateral dimension 114a of the opening is so that even the largest of the chips in FIGS. 2A and 2B will fit inside the opening. Dependent on the number of chips to be accommodated, more than one opening may have to be formed.

Next, sheets 701 (see FIG. 7) of an insulating and adhesive material are provided. Preferably, the material includes an epoxy-based (bisphenol, cycloaliphatic, novolac, etc.) B-stage compound without fillers. Commercial sources include Ablestik, Henkel, Namics, Nagase, and Hitachi Chemicals (AS2600, AS3000). While the sheets are controlled sheets at ambient temperature, the material has a known elevated temperature range (for instance, about 50 to 125° C.) for softening and another more elevated temperature window (for instance, about 100 to 200° C.) for complete polymerization. The preferred thickness range of the sheets is between about 10 and 100 μm.

Figure 7:
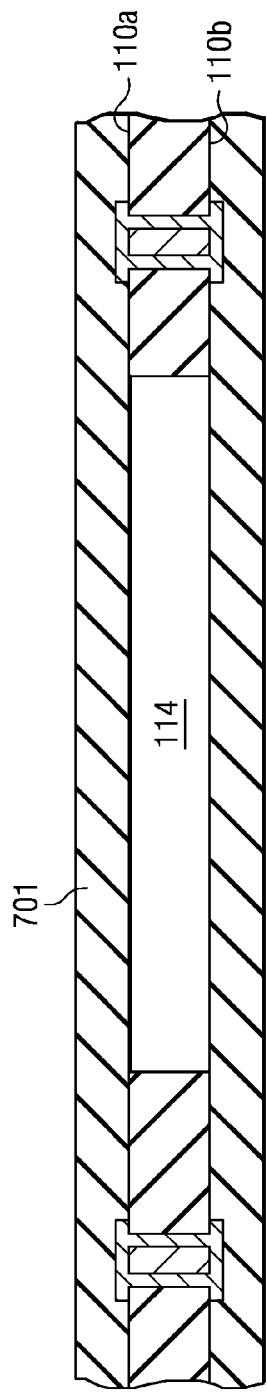

In the next process step, shown in FIG. 7, the first (110a) and the second (110b) interposer surfaces are laminated with the sheets 701 so that the sheets stretch over the opening and thus close off the opening.

Next (see FIGS. 8 and 9), insulating tapes are provided, which are integral with conductive traces. Dependent on the number of metallization levels, the tape thickness may reach from about 25 to 200 μm. The tapes have surfaces with contact pads. Preferably, the tapes are made of polyimide-based materials with a modulus between about 3 and 9 GPa; consequently, the tape modulus is 50% or less than the interposer modulus.

Figure 8:
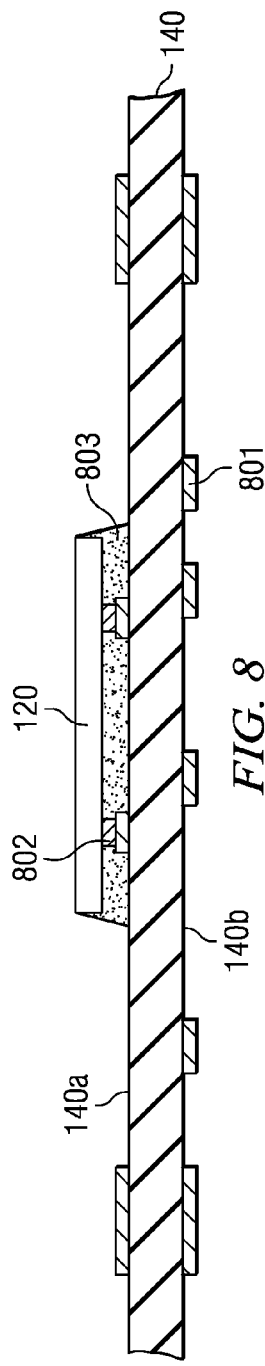

In FIG. 8, the first insulating tape 140 is shown having smaller thickness than the second tape 150 in FIG. 9. Tape surface 140a (the third surface) and surface 140b (the fourth surface) have contact pads 801. The active surface of the first chip 120 is flip-attached (using metal bumps 802 such as gold, copper or solder) to the contact pads 801 on the third tape surface 140a. The attached chip may be underfilled with a polymeric precursor 803.

In FIG. 9, the second insulating tape 150 is shown having greater thickness than the first tape 140 in FIG. 8, because it is selected to provide multi-layer metal layers. Tape surface 150a (the fifth surface) and surface 150b (the sixth surface) have contact pads 901. The active surface of the second chip 130 is flip-attached (using metal bumps 902 such as gold, copper or solder) to the contact pads 901 on the fifth tape surface 150a. The attached chip may be underfilled with a polymeric precursor 903.

In the next process steps, displayed in FIG. 10, the first chip assembly 1001 and the second chip assembly 1002 are aligned with the opening of the sheet-covered interposer 1003; in this alignment step, the passive chip surfaces 122 and 132 face each other. Then, the ambient temperature is raised to soften the sheets; in FIG. 10, the softening is indicated by the sagging of the sheets. The elevated temperature depends on the selected B-stage compound of sheet 701; for many epoxy-based compounds, the range may be between about 50 and 125° C.

Figure 11:
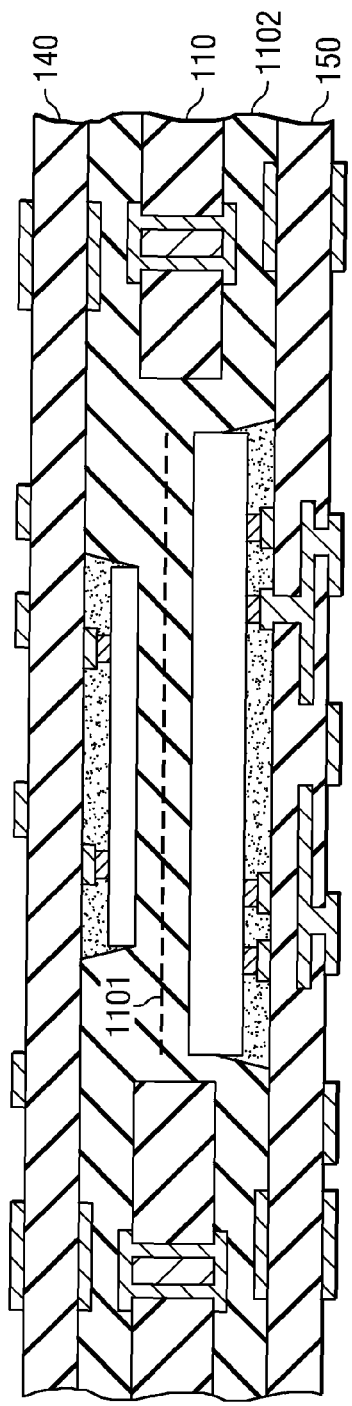

The chips are then moved from opposite directions (indicated by arrows 1004 in FIG. 10) against the respective sheets, pressuring the passive surfaces 122 and 132 against the respective sheets to cover the assembled chips and deform the sheets into the opening until the sheets meet at an interface (the air outlets are not shown in FIG. 10). The interface is designated 1101 in FIG. 11. Concluding this process step, the assembled chips are pressed against each other to minimize the remaining thickness of the adhesive material between the passive chip surfaces, and to squeeze the adhesive material sidewise. As a result, the compound of the sheets fills the available space 1102 between the interposer, tapes, and chips with adhesive material. On the other hand, as FIG. 11 illustrates, first tape 140 and second tape 150 remain substantially parallel as well as adhering to the rigid interposer 110.

In the next process step, the temperature of the assembly is raised still higher (between about 100 and 200° C.) for the period of time needed to fully polymerize ("cure") the adhesive material. The curing can be performed in the lamination machine or in a separate oven.

Figure 12:
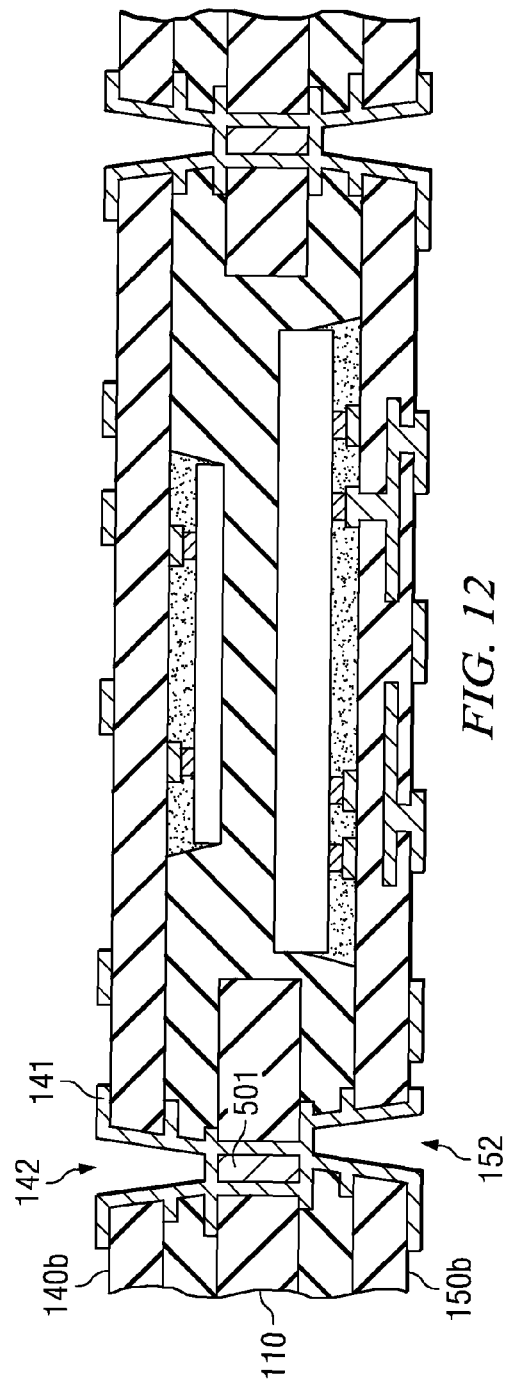

As depicted in FIG. 12, vias 142 are fabricated in the next process step in order to provide electrical connection between the contact pads 141 and the vias 501 through the interposer. Using lasers, openings are drilled from the top tape surface 140b to the top of vias 501 through the interposer 110. After the drilling, the openings are filled with copper paste of lined with copper sidewalls. Similarly, lasers drill the openings 152 from the bottom substrate surface 150b to the bottom of vias 501; thereafter, the openings are filled with copper paste or lined with copper sidewalls.

Figure 13:
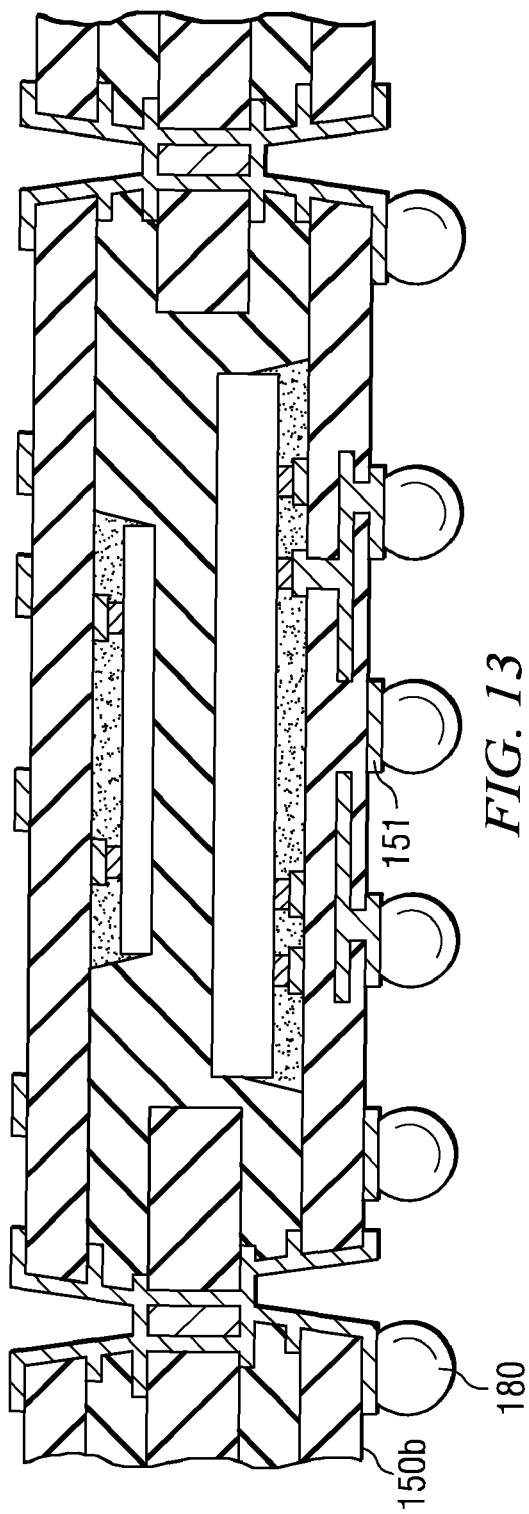

In FIG. 13, reflow bodies 180, such as tin-alloy solder balls, are attached to the contact pads 151 on the sixth surface.

Figure 14:
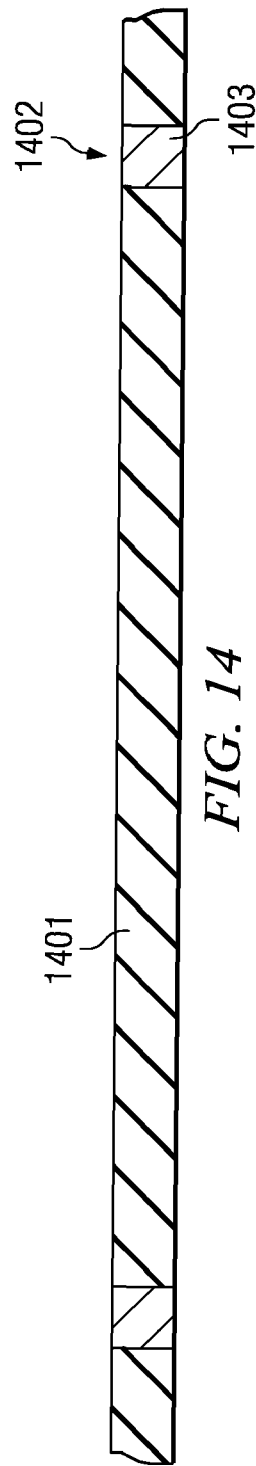
FIG. 14 is a schematic cross section of an insulating adhesive sheet according to another embodiment of the invention.

Another embodiment of the invention is illustrated in FIGS. 14 to 17. The embodiment involves a variation of the adhesive B-stage sheet employed in FIG. 7 in order to simplify the electrical contacts to the metal-filled vias through the interposer. FIG. 14 shows the sheet 1401 of thermo-setting polymer adhesive material with pre-punched vias 1402. The locations of the vias are analogous to the locations of the vias through the interposer. The vias in the sheet are filled (preferably by screen printing) with conductive paste 1403, preferably using copper fillers. Alternatively, silver or solder filled pastes may be used, or other suitable metals or metal alloys. Several companies offer commercial sheets with pre-filled vias in customized locations.

Sheet 1401 is preferably epoxy-based such as bisphenol, cycloaliphatic, novolac, etc., and may be re-inforced with non-conductive fillers or fibers such as silica particles, long or short glass fibers, aramid fibers, etc. Commercial suppliers include Ablestik, Dexter, Namics, Nagase, Panasonic, Dupont, Nikko Denko, and Hitachi Chemicals.

Figure 15:
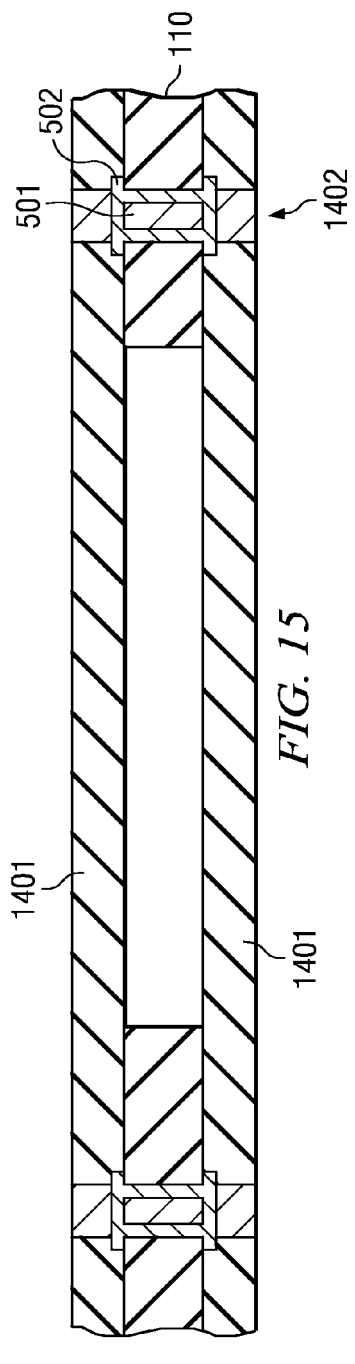
FIG. 15 shows a schematic cross section of two insulating, adhesive sheets (FIG. 14) laminated over the interposer and the opening.

FIG. 15 depicts the lamination of sheet 1401 on the interposer to cover the interposer opening, analogous to FIG. 7. The sheets on the top and the bottom sides of the interposer 110 are aligned so that the polymer-filled openings 1402 align with the surface layer 502 of the metal-filled vias 501.

Figure 16:
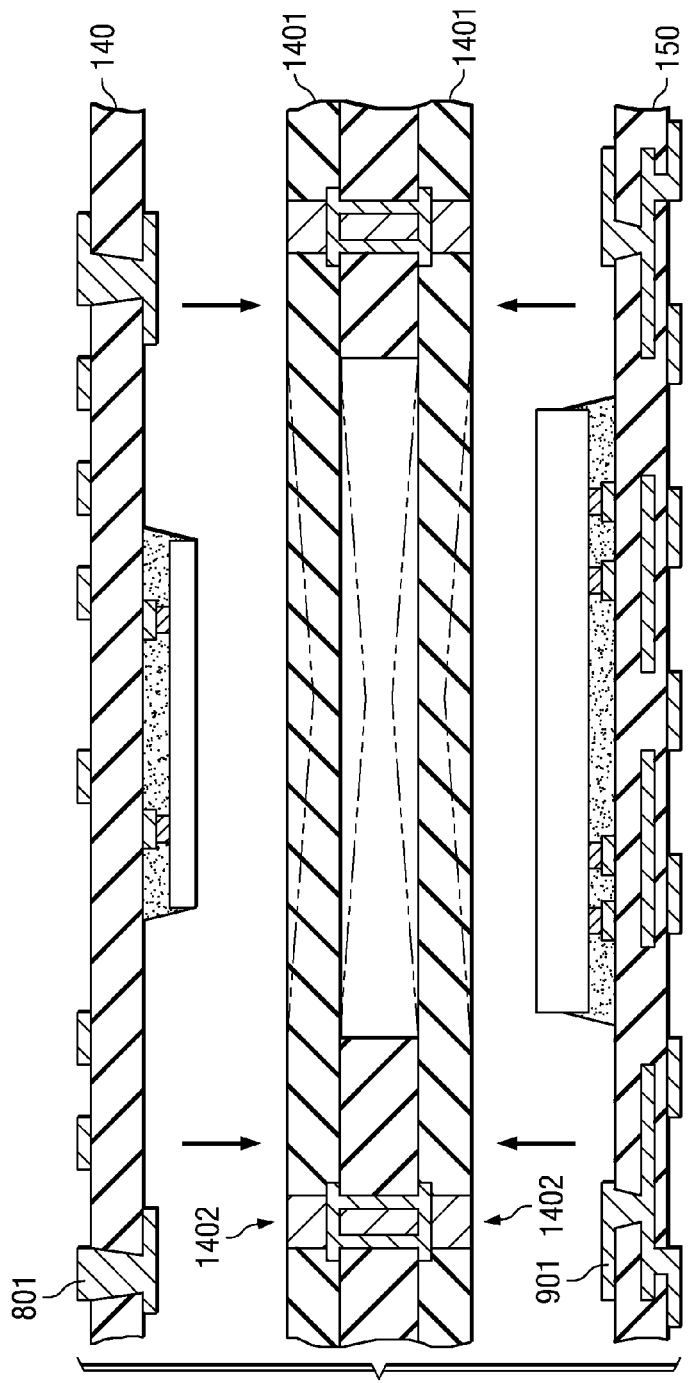
FIG. 16 illustrates schematically the process step of aligning the assembled chips with the sheet-covered opening and moving the chips to deform the sheets configured as shown in FIG. 14.
Figure 17:
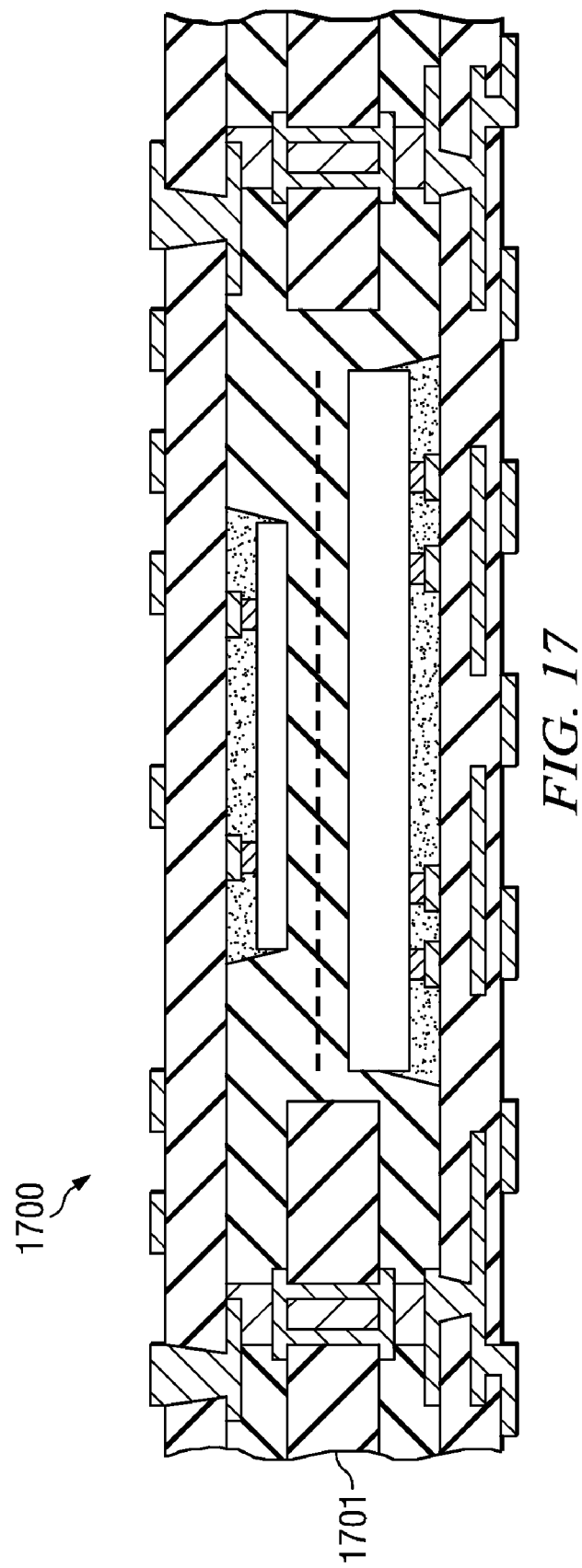
FIG. 17 illustrates a schematic cross section of the integrated substrate after the available space between the interposer, tapes and chips is filled with adhesive material, and electrical connection between top and bottom substrate surfaces is already established.

The action illustrated in FIG. 16 is analogous to the action described in FIG. 10. The difference is that the contact pads 801 on the third surface (tape 140) and the contact pads 901 on the fifth surface (tape 150) can contact the metal-filled openings 1402 of sheets 1401 directly. Consequently, there is no need to form via openings and contacts (see vias 142 and 152 in FIG. 12) in a later process step (as was described in FIG. 12). FIG. 17 highlights the finished substrate system, generally designated 1700, without connecting vias.

In many device processes, substrate 1700 is still in strip form, as indicated in FIG. 17 by contours 1701. For other devices, substrate 1700 may already be singulated from the strip into discrete units, preferably by sawing.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

As an example, the invention applies to products using any type of semiconductor chip, discrete or integrated circuit, or using multiple chips, or chips made of semiconductor materials including silicon, silicon germanium, gallium arsenide, or any other semiconductor or compound material used in integrated circuit manufacturing.

As another example, the opening in the interposer may be formed after the B-stage adhesive sheets have been applied. In this case, the sheets have enough thickness to supply the material needed to fill the spaces between chips, tapes, and interposer.

It is therefore intended that the appended claims encompass any such modifications or embodiment.

I claim:

1. A semiconductor system comprising:
   a rigid insulating interposer having a first and a second surface, a thickness, and a modulus;
   conductive traces on the first and the second surface;
   cylindrical metal-filled vias extending through the thickness from the first to the second surface, contacting the traces;
   an opening through the thickness, the opening having a length;
   a first semiconductor chip having an active and a passive surface, a thickness, and a length;
   a second semiconductor chip having an active and a passive surface, a thickness, and a length;
   the interposer thickness being equal to or greater than the thickness sum of the first and second chips;
   the length of the opening being greater than the length of the first and the second chip;
   a first insulating tape having conductive traces, a third and a fourth surface including contact pads, and a modulus;
   a second insulating tape having conductive traces, a fifth and a sixth surface including contact pads, and a modulus;
   the modulus of the first and the second tape being 50% or less of the interposer modulus;
   the active surface of the first chip flip-attached to the contact pads of the third surface;
   the active surface of the second chip flip-attached to the contact pads of the fifth surface;
   the attached first and second chips located inside the opening so that the first and second tapes are spaced substantially parallel to the interposer;
   the passive surfaces of the chips attached by a layer of an adhesive material;
   the first surface attached to the third surface by a layer of the same adhesive material; and
   the second surface attached to the fifth surface by a layer of the same adhesive material.

2. The system according to claim 1 wherein the interposer is a rigid glass-filled epoxy having a modulus between about 18 and 25 GPa, and a thickness between about 30 and 250 pm.

3. The system according to claim 1 wherein the first and second tapes are polyimide-based materials having a modulus between about 3 and 9 GPa, and a thickness between about 25 and 200 pm.

4. The system according to claim 1 wherein the adhesive material is an epoxy-based B-stage compound, and the layer has a thickness between about 10 and 100 pm.

5. The system according to claim 1 further having active or passive electrical components attached to the contact pads of the fourth surface of the first tape.

6. The system according to claim 1 further having reflow bodies attached to the contact pads of the sixth surface of the second tape.

7. A semiconductor system comprising:
- a first insulating film having a first modulus and a first semiconductor chip affixed thereon;
- a second insulating film having a second semiconductor chip affixed thereon;
- an insulating interposer having a thickness and a modulus greater than two times the first modulus;
- a window in the interposer,
- a first adhesive film contacting the first insulating film and the passive surface of the first semiconductor chip, affixing the first insulating film to a first flat surface of the interposer with the first semiconductor chip confined in the window;
- a second adhesive film contacting the second insulating film and the passive surface of the second semiconductor chip, affixing the second insulating film to a second flat surface of the interposer opposite the first flat surface with the second semiconductor chip confined in the window; and
- a gap between the first semiconductor chip and the second semiconductor chip smaller than the interposer thickness.

8. The semiconductor system of claim 7, in which the second insulating film has a modulus similar to that of the first insulating film.

9. A semiconductor system comprising:
- a first insulating film having a first semiconductor chip of a first thickness affixed thereon;
- a second insulating film having a second semiconductor chip of a second thickness affixed thereon;
- an insulating interposer having a thickness not thinner than the sum of the first thickness and the second thickness having a window therein,
- a first adhesive film contacting the first insulating film and the passive surface of the first semiconductor chip, affixing the first film to a first flat surface of the interposer with the first semiconductor chip confined in the window;
- a second adhesive film contacting the second insulating film and the passive surface of the second semiconductor chip, affixing the second insulating film to a second flat surface of the interposer opposite the first flat surface with the second semiconductor chip confined in the window; and
- a gap between the first semiconductor chip and the second semiconductor chip smaller than the interposer thickness.

10. The semiconductor system of claim 9, in which the first insulating film has a first modulus and the second insulating film has a second modulus similar to the first modulus.

11. The semiconductor system of claim 9, in which the gap is filled with a polymeric material.

12. The semiconductor system of claim 7, in which the gap is filled with a polymeric material.

\* \* \* \* \*